US012596278B2

(12) United States Patent
Nik Zakiyamani et al.

(10) Patent No.: US 12,596,278 B2
(45) Date of Patent: Apr. 7, 2026

(54) DUAL-VIEWING MODE MOTOR VEHICLE DISPLAY SYSTEM

(71) Applicant: Continental Automotive Technologies GmbH, Hannover (DE)

(72) Inventors: Nik Mohamed Nik Zakiyamani, Kubang Semang (MY); Raja Kamal Zulhakimie Bin Raja Ahmad, Kulim (MY)

(73) Assignee: Continental Automotive Technologies GmbH, Hannover (DE)

( * ) Notice: Subject to any disclaimer, the term of this patent is extended or adjusted under 35 U.S.C. 154(b) by 0 days.

(21) Appl. No.: 18/983,891

(22) Filed: Dec. 17, 2024

(65) Prior Publication Data

US 2025/0199362 A1     Jun. 19, 2025

(30) Foreign Application Priority Data

Dec. 19, 2023     (GB) ...................................... 2319459

(51) Int. Cl.
B60K 35/53          (2024.01)
B60K 35/00          (2024.01)
(Continued)

(52) U.S. Cl.
CPC ........ G02F 1/133626 (2021.01); B60K 35/00 (2013.01); B60K 35/10 (2024.01);
(Continued)

(58) Field of Classification Search
CPC .......... B60K 35/53; G02B 6/38; G02B 26/08; G02B 27/0179; G02B 2207/123; G02F 1/1323; G02F 1/133626
See application file for complete search history.

(56) References Cited

U.S. PATENT DOCUMENTS

| | | | | |
|---|---|---|---|---|
| 2019/0375514 A1* | 12/2019 | Lampazzi | ................ | G09G 5/38 |
| 2020/0278745 A1 | 9/2020 | Jung et al. | | |

(Continued)

FOREIGN PATENT DOCUMENTS

| | | |
|---|---|---|
| CN | 101044547 A | 9/2007 |
| CN | 109270857 A | 1/2019 |

(Continued)

OTHER PUBLICATIONS

Search Report dated Apr. 22, 2024 from corresponding GB patent application No. 2319459.0.

(Continued)

*Primary Examiner* — Keith G. Delahoussaye
(74) *Attorney, Agent, or Firm* — COZEN O'CONNOR

(57)          ABSTRACT

Disclosure relates to a dual-viewing mode motor vehicle display system. The display system may comprise at least one displaying portion operable to display contents and a processor having a memory. The processor may have a set of instructions stored thereon, retrievable from the memory. The at least one displaying portion may further comprise at least one illumination unit. The at least one illumination unit may comprise a plurality of micro fin structures. The plurality of micro fin structures may be configured to provide a wide viewing mode and a narrow viewing mode. The processor may be operable to kinematically change a position of the at least one displaying portion about a rotation axis. In response to the kinematically changed position, the at least one displaying portion may switch between a public mode position to display public mode contents and a private mode position to display private mode contents.

16 Claims, 5 Drawing Sheets

200

(51) Int. Cl.

| | |
|---|---|
| *B60K 35/10* | (2024.01) |
| *B60K 35/21* | (2024.01) |
| *B60K 35/22* | (2024.01) |
| *B60K 35/28* | (2024.01) |
| *B60K 35/29* | (2024.01) |
| *B60K 35/60* | (2024.01) |
| *B60K 35/65* | (2024.01) |
| *B60K 35/81* | (2024.01) |
| *G02B 1/00* | (2006.01) |
| *G02B 26/08* | (2006.01) |
| *G02F 1/13* | (2006.01) |
| *G02F 1/1335* | (2006.01) |
| *G02F 1/13357* | (2006.01) |
| *H05K 5/02* | (2006.01) |

(52) U.S. Cl.
CPC ............ *B60K 35/211* (2024.01); *B60K 35/22* (2024.01); *B60K 35/28* (2024.01); *B60K 35/29* (2024.01); *B60K 35/53* (2024.01); *B60K 35/60* (2024.01); *B60K 35/654* (2024.01); *B60K 35/656* (2024.01); *B60K 35/658* (2024.01); *B60K 35/81* (2024.01); *G02B 1/005* (2013.01); *G02B 26/08* (2013.01); *G02F 1/1323* (2013.01); *G02F 1/133606* (2013.01); *H05K 5/0217* (2013.01); *B60K 2360/1526* (2024.01); *B60K 2360/33* (2024.01); *G02B 2207/123* (2013.01)

(56) References Cited

U.S. PATENT DOCUMENTS

| | | | |
|---|---|---|---|
| 2021/0072943 A1 | 3/2021 | Enokida et al. | |
| 2021/0155167 A1* | 5/2021 | Lynam | B60R 1/12 |
| 2021/0284022 A1* | 9/2021 | Lee | B60W 60/005 |
| 2022/0155631 A1 | 5/2022 | Xin et al. | |
| 2023/0051655 A1 | 2/2023 | Someya et al. | |
| 2023/0150439 A1 | 5/2023 | Chen et al. | |

FOREIGN PATENT DOCUMENTS

| | | | | |
|---|---|---|---|---|
| CN | 113401067 | 9/2021 | | |
| DE | 102021200422 | 7/2022 | | |
| FR | 3062485 A1 * | 8/2018 | .......... | G02B 6/0076 |
| GB | 2426352 A | 11/2006 | | |
| JP | 2005112291 A * | 4/2005 | | |

OTHER PUBLICATIONS

"Display and Interaction Systems" 2023, Robert Bosch GmbH.
"Marelli presents 'In-Cabin Advanced Technology Showcase' at Auto Shanghai 2023 for an immersive experience into next-generation cockpit technologies", 2023, Marelli Holdings Co., Ltd.
"Switchable Privacy for Automotive", 2023, siOPTICA GmbH.
"Continental Display with Private Mode Entertains Passengers and Reduces Driver Distraction", Press Release, Apr. 26, 2022, Continental AG.
Examination Report dated May 6, 2025 from corresponding European patent application No. 24220419.6.
Extended European Search Report of corresponding European Patent Application No. 24220419.6-1009, dated Oct. 21, 2025.

* cited by examiner

100

112

116

120

134

B

200

DUAL-VIEWING MODE MOTOR VEHICLE DISPLAY SYSTEM

CROSS REFERENCE TO RELATED CASES

This US patent application claims the benefit of GB patent application No. 2319459.0, filed Dec. 19, 2023, which is hereby incorporated by reference.

TECHNICAL FIELD

This disclosure relates to a motor vehicle display system and more in particular a motor vehicle display system with dual-viewing mode. Specifically, the motor vehicle display system operates in public mode to display contents to one or more occupants and in a private mode to display contents to a single occupant.

BACKGROUND

Increasingly, digital displays are replacing analogue instrument clusters in the transportation industry, which allows occupants to enjoy onboard entertainment onboard motor vehicle. While modern motor vehicles are transforming into personal smartphone or computer on wheels, driver distraction is still a main cause of traffic accidents and safety of driver and vehicle occupants remains an important objective for motor vehicle manufacturers.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A purpose of this disclosure is to ameliorate the problem of distraction to vehicle operator by providing the subject-matter of the independent claims.

In an aspect of this disclosure, a dual-viewing mode motor vehicle display system is provided. The display system may comprise at least one displaying portion operable to display contents and a processor having a memory. The processor may have a set of instructions stored thereon, the set of instructions retrievable from the memory. The at least one displaying portion may further comprise at least one illumination unit. The at least one illumination unit may comprise a plurality of micro fin structures. The plurality of micro fin structures may be configured to provide a wide viewing mode and a narrow viewing mode. The processor may be operable to kinematically change a position of the at least one displaying portion about a rotation axis. In response to the kinematically changed position, the at least one displaying portion may switch between a public mode position to display public mode contents and a private mode position to display private mode contents.

In some embodiment, the plurality of micro fin structures may further comprise a wide-angle arrangement to reflect light rays supplied by the at least one illumination unit to provide the wide viewing mode. In some embodiment, the plurality of micro fin structures may further comprise a narrow angle arrangement to reflect light rays supplied by the at least one illumination unit to provide the narrow viewing mode.

In some embodiment, each of the plurality of micro fin structures may be configured to tilt substantially between 50 degrees to 70 degrees along an axis to provide the wide-angle arrangement. In some embodiment, each of the plurality of micro fin structures may be configured to tilt between 10 degrees to 40 degrees along an axis to provide the wide-angle arrangement.

In some embodiment, the processor may be operable to rotate about the at least one displaying portion about the rotation axis between 15 degrees to 35 degrees. In some embodiment, the processor may be operable to rotate about the at least one displaying portion about the rotation axis at 20 degrees.

In some embodiment, the system may further comprise at least a second displaying portion. In some embodiment, the at least a second displaying portion may be displaced adjacent to the at least one displaying portion.

In some embodiment, the processor may be operable to kinematically change position of the at least one displaying portion to the private mode position and switch the at least one displaying portion to the private mode display content.

In some embodiment, the processor may be operable to kinematically change position of the at least one displaying portion to private mode position. The processor may be further operable switch the at least one displaying portion to the private mode display content and switch to the at least a second displaying portion to the private mode display content public mode position.

In some embodiment, in response to the at least one displaying portion switching to a public mode position, the processor may be operable to cause the at least one displaying portion to display public mode contents. In some embodiment, the public mode contents may comprise a welcome note. In some embodiment, the public mode contents may comprise motor vehicle operating information. In some embodiment, the public mode contents may comprise a digital decorative content.

In some embodiment, in response to the at least one displaying portion switching to the private mode position, the processor may be operable to cause the at least one displaying portion to display private mode contents. In some embodiment, the private mode contents may comprise gaming content. In some embodiment, the private mode contents may comprise video streaming, for example television broadcast contents.

In some embodiment, when at public mode position, the at least one displaying portion has a viewing angle between 20 degrees to 80 degrees. In some embodiments, when at public mode position, the at least one displaying portion has a viewing angle at 50 degrees.

In some embodiment, the at least one displaying portion may be mounted to at least a portion of a surface of a cockpit of a motor vehicle. In some embodiment, the at least one displaying portion may be mounted to a central portion of a cockpit of a motor vehicle, the central portion relative to a width of the motor vehicle.

BRIEF DESCRIPTION OF DRAWINGS

The present disclosure will become more fully understood from the detailed description and the accompanying drawings, wherein.

Figure 1:
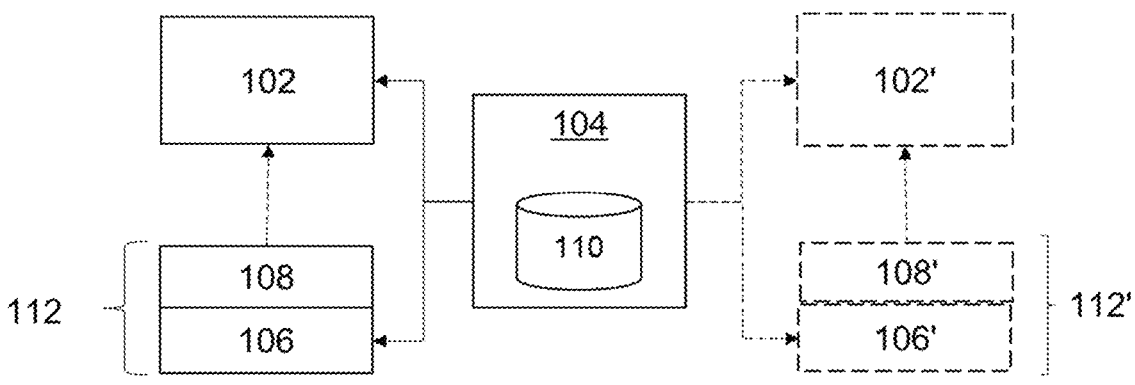
FIG. 1 shows a block diagram of a display system in accordance with this disclosure.

In various embodiments described by reference to the above figures, like reference signs refer to like components in several perspective views and/or configurations.

DETAILED DESCRIPTION

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

Hereinafter term "processor" used herein may broadly encompass a general-purpose processor, a central processor (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration. The "processor" may include a memory, for loading a sequence of instruction, causing the "processor" to perform steps of actions. The term "memory" should be interpreted broadly to encompass any electronic component capable of storing electronic information. The term "memory" may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. "Memory" is said to be in electronic communication with a processor if the processor can read information from and/or write information to the memory. Memory that is integral to a processor is in electronic communication with the processor. Henceforth, the term "processor" may also be taken to encompass "system on chip" (SoC) which uses a single integrated circuit (IC) chip that contains multiple resources, computational units, processors and/or cores integrated on a single substrate. A single SOC may contain circuitry for digital, analog, mixed-signal, and radio-frequency functions, as well as any number of general purpose and/or specialized processors (digital signal processors, modem processors, video processors, etc.), memory blocks (e.g., ROM, RAM, Flash, etc.). Unless otherwise specifically stated, the "processor" is not limited to any specific combination of hardware circuitry and software, nor to any particular source for the instructions executed by the processor.

Referring to FIG. 1 which shows a block diagram of a dual-viewing mode display system 100 in accordance with this disclosure, the system 100 may comprise at least one displaying portion 102 and a processor 104 having a memory 110. The memory 110 may include a set of instructions stored thereon, of which the set of instructions may be retrievable from the memory 110 and cause a sequence of steps to be executed.

In some embodiments, the system 100 may include at least a second displaying portion 102', the at least a second displaying portion 102' may further include the illumination unit 112' as described above.

In some embodiment, the at least a first displaying portion 102 and the at least a second displaying portion 102' may be operable by one processor 104 having a memory 110. In some embodiment an auxiliary processor similar to processor 104 may be required.

The at least one display 102 may further comprises at least one illumination unit 112. The at least one illumination unit 112 may further comprise a plurality of micro fin structures 108, the plurality of micro fin structures configured to provide a wide viewing mode and a narrow viewing mode. The viewing mode is achieve by reflecting light rays propagating or supplied by a light source 106. In some embodiment, the light source 106 may be a matrix backlight unit, with multiple light sources, each of the light sources operable by a controller or processor, to switch on and/or switch off independently, to achieve local dimming effect.

Figure 2:
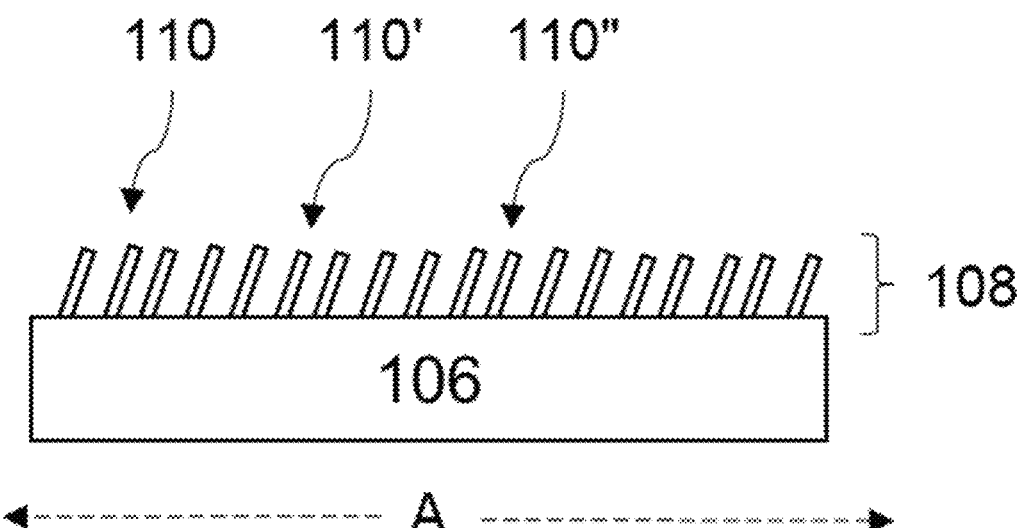
FIG. 2 shows an illumination unit in accordance with this disclosure.

In some embodiment, the plurality of micro fin structures 108 may be made of material having optical properties. In some embodiment, the plurality of micro fin structures 108 may an optical film with micro fin structures operable to reflect light rays supplied by the plurality of light sources 106. As shown in FIG. 2 is an illumination unit 112 in accordance with this disclosure, as described above. In both embodiments as discussed above, the plurality of plurality of micro fin structures 108 are integrated with the plurality of light sources 106 or the matrix backlight unit to provide a single piece of illumination unit 112.

Each of the fin structure 110, 110', 110'' is configured to reflect light rays from the light source 106 towards a display layer, of which display contents are shown in an active displaying zone for viewing when the light rays propagate through the display layer.

In some embodiment, the plurality of micro fins structures may be a wide-angle arrangement to reflect light rays supplied by the at least one illumination unit 112, 112' to provide the wide viewing mode. In some embodiment, a narrow angle arrangement to reflect light rays supplied by the at least one illumination unit 112, 112' to provide the narrow viewing mode.

For the narrow angle arrangement, each of the plurality of micro fin structures 110, 110', 110'' may be arranged to tilt between 10 degrees to 49 degrees along an axis, A, to provide the narrow angle arrangement.

For the wide-angle arrangement, each of the plurality of micro fin structures 110, 110', 110'' may be configured to tilt substantially between 50 degrees to 70 degrees along an axis, A, to provide the wide-angle arrangement.

Figure 3:
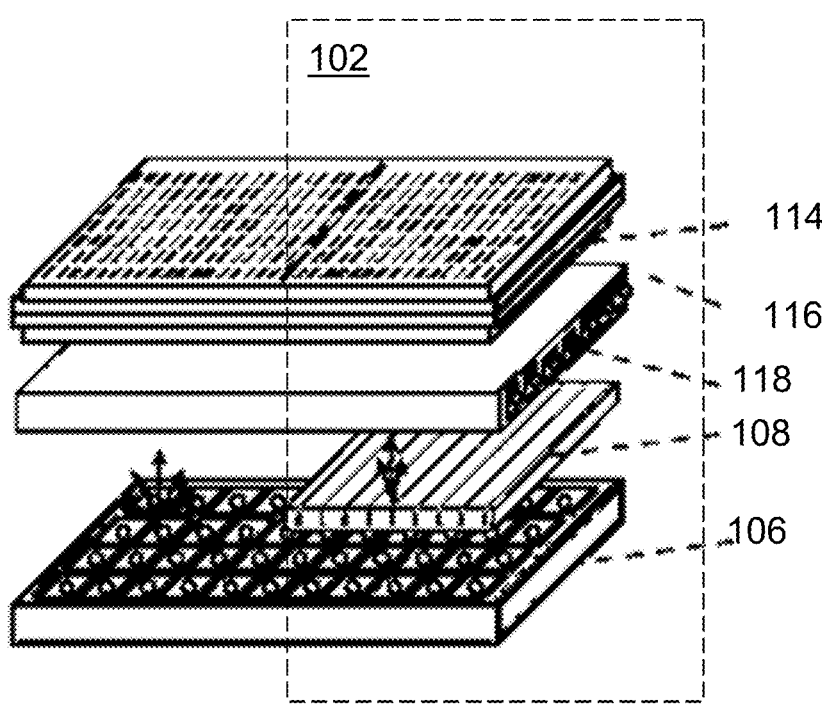
FIG. 3 shows an exploded view of a displaying portion apparatus in accordance with this disclosure.

FIG. 3 shows an exploded view of a displaying portion apparatus 116 in accordance with this disclosure. The at least one displaying portion 102, 102' may include a backlight unit comprising multiple light sources as shown in FIG. 3, with a plurality of micro fin structure 108 displaced adjacent to the light source 106. In some embodiment, the at least one displaying portion 102, 102' may further include an auxiliary light source 118 with multiple light sources, each of the light sources operable by a controller or processor. A suitable auxiliary light source 118 may be an edge-lit backlight unit operable to supply light rays from a length of the display apparatus, through a display layer 114.

In some embodiment, the at least a first displaying portion 102 may be one as disclosed herein and at least a second displaying portion may be a conventional display apparatus, without the plurality of micro fin structure 108.

Figure 4A:
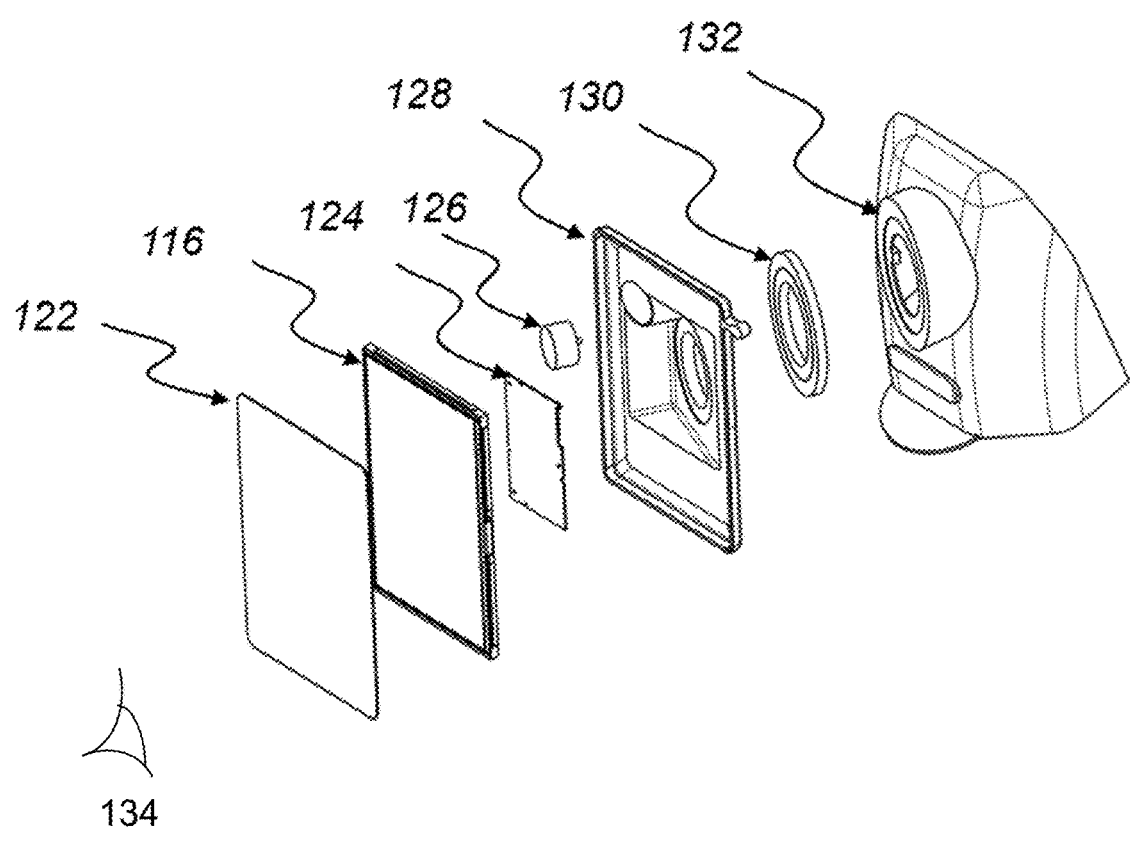
FIG. 4a shows an exploded view of a displaying portion assembly with a mounting device in accordance with this disclosure.

FIG. 4a shows an exploded view of a displaying portion assembly 120 with a mounting device in accordance with this disclosure.

The displaying portion assembly 120 comprises a displaying portion apparatus 116 such as one shown in FIG. 3, a circuitry 124, rotating means 130. The rotating means 130 may be mounted on a surface 132 of a mounting means. Optionally, the displaying portion assembly 120 may further include a cover glass 122 for covering the displaying portion apparatus 116, a rotating means 126, such as a motor, and a cover 128 for covering the rotating means. The rotating means 130 is operable to rotate the displaying portion assembly 120 about a rotation axis, B, thus changing a position of the displaying portion apparatus 116. A human user 134 be able to view contents displayed on the displaying portion when the displaying portion apparatus 116 is in operation.

Figure 5A:
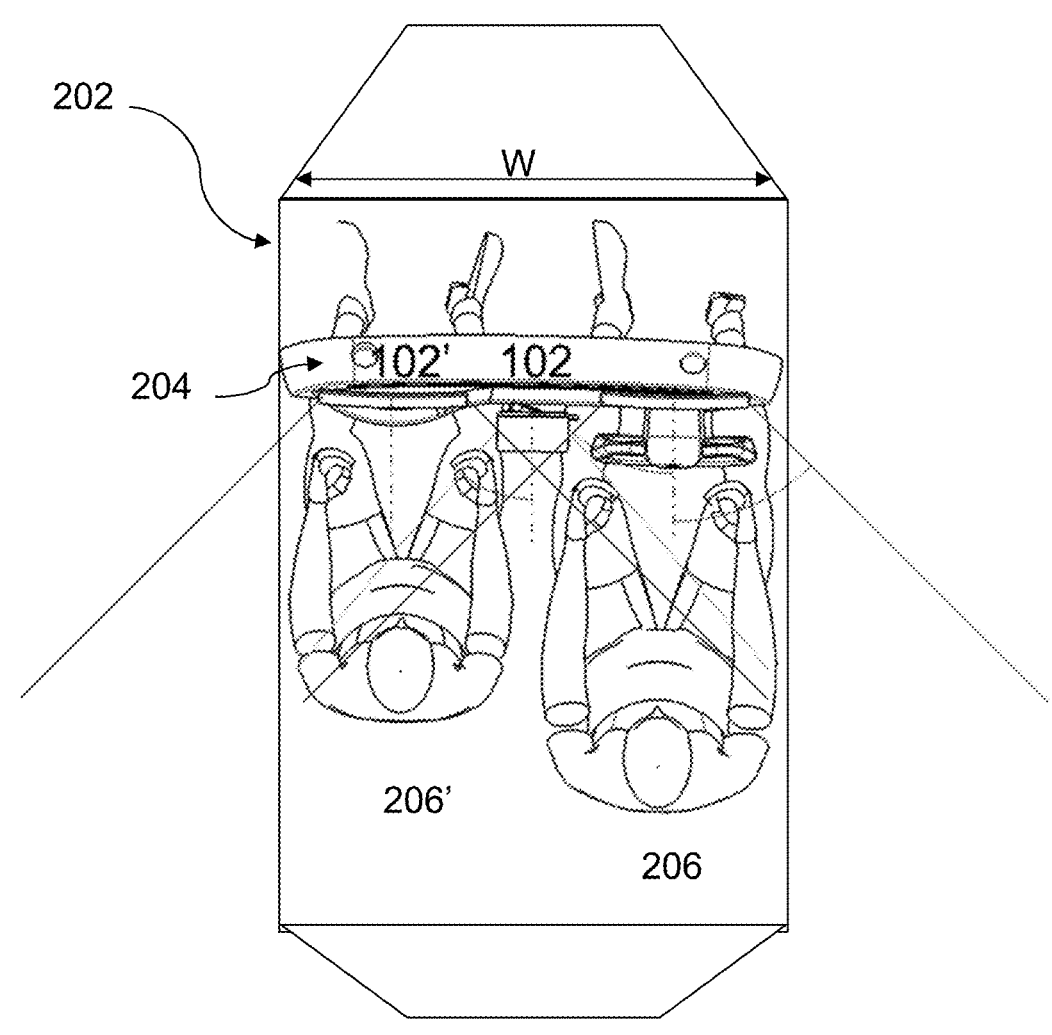
FIG. 5a shows a top view of a vehicle display system in a motor vehicle in accordance with this disclosure.

FIG. 5a shows a top view of a vehicle display system 200 in a motor vehicle 202. As shown in FIG. 5A, the vehicle display system 200 may comprises at least one displaying portion 102 and at least a second displaying portion 102'. The at least one displaying portion 102, 102' may be mounted to at least a portion of a surface of a cockpit of a motor vehicle. In some embodiment, at least one displaying portion 102 is mounted on to at least a portion of a surface 132 of a cockpit of a motor vehicle 202. The surface 204 may be a cockpit of a motor vehicle 202. Referring to FIG. 5a, the at least one displaying portion 102, 102' is at a public mode position, with the displaying portion facing vehicle occupant 206, 206'. The vehicle occupant 206, 206' may be a vehicle operator, a co-vehicle operator, and/or a front motor vehicle passenger. In some embodiment, when at public mode position, the at least one displaying portion has a viewing angle between 20 degrees to 80 degrees. In some embodiment, when at public mode position, the at least one displaying portion has a viewing angle at 50 degrees.

In some embodiment, the at least one displaying portion 102, 102' may be mounted to a central portion of a cockpit of a motor vehicle 202, the central portion relative to a width, W, of the motor vehicle 202.

Figure 4B:
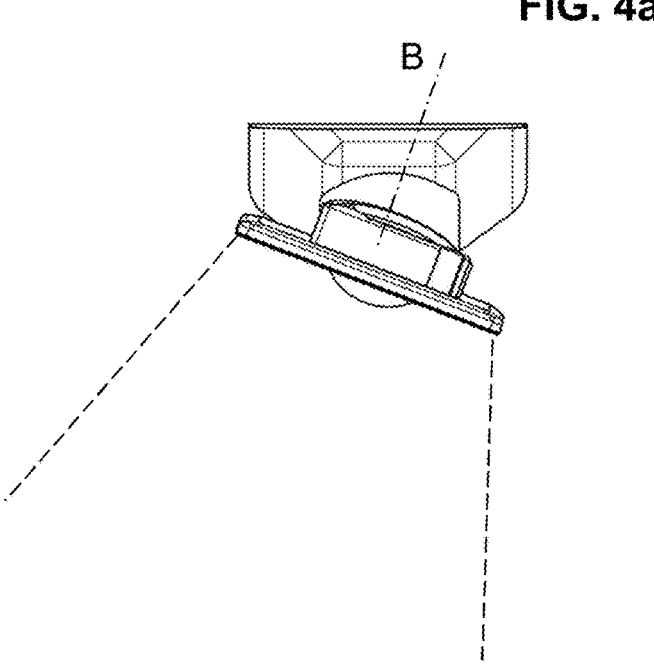
FIG. 4b shows a top view of a displaying portion assembly with a mounting device in accordance with this disclosure.
Figure 5B:
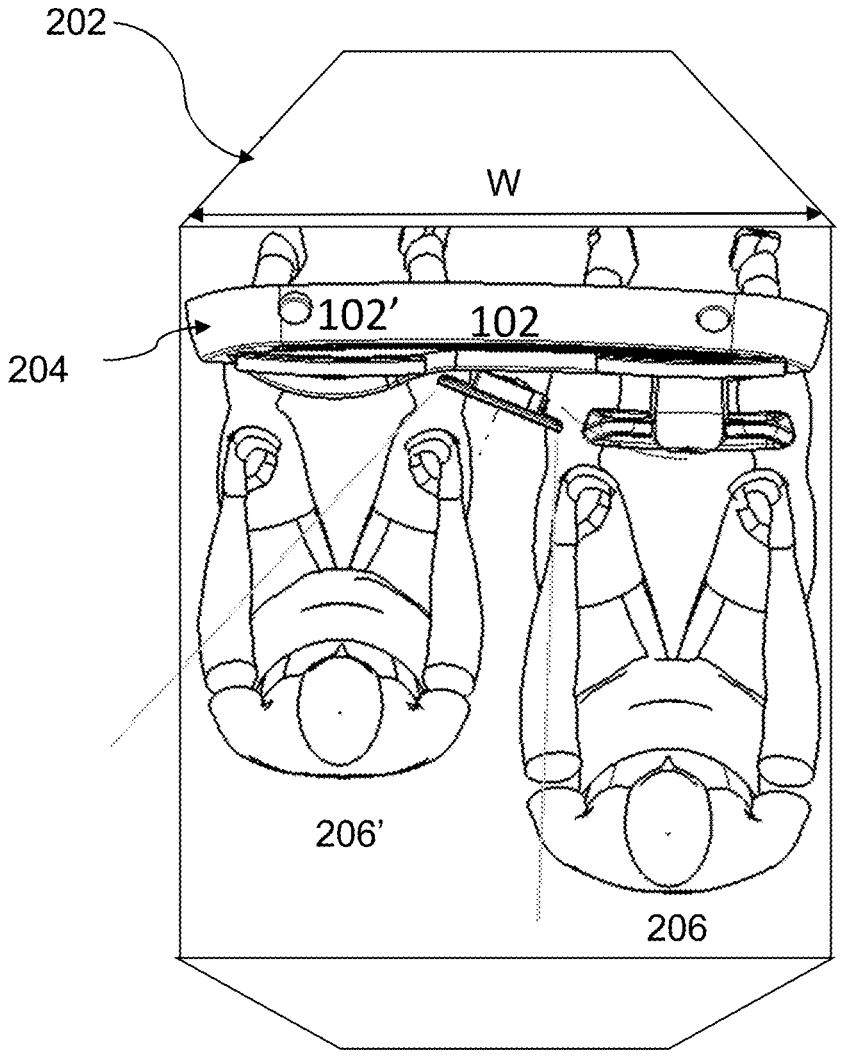
FIG. 5b shows a top view of a vehicle display system in a motor vehicle in accordance with this disclosure.

The vehicle display system 200 may further comprises a processor such as one described in FIG. 1. The processor 104 may be operable to kinematically change a position of the at least one displaying portion 102, 102' about a rotation axis, B, as shown in FIG. 4b of the accompanying drawings illustrating a top view of the displaying portion assembly 120. In response to the kinematically changed position, the at least one displaying portion 102, 102' switches between a public mode position to display public mode contents to a private mode position to display private mode contents as shown in FIG. 5b.

The kinematic motion of the at least one displaying portion 102, 102' may be controlled by the processor 104 to automate the change of position between a public mode position and a private mode position. In some embodiment, the processor 104 may be operable to rotate about the at least one displaying portion 102, 102' about the rotation axis, B, between 10 degrees to 40 degrees. In some embodiment, the processor 104 may be operable to rotate about the at least one displaying portion 102, 102' about the rotation axis, B, between 15 degrees to 35 degrees. In some embodiment, the processor 104 is operable to rotate about the at least one displaying portion 102, 102' about the rotation axis at 20 degrees. As already explained above, the system 200 may further comprising at least a second displaying portion 102, 102'. The at least a second displaying portion 102, 102' may be displaced adjacent to the at least one displaying portion 102, 102' as shown in both FIG. 5a and FIG. 5b.

In some embodiment, the processor 104 may be operable to kinematically change position of the at least one displaying portion 102, 102' to the private mode position and switch the at least one displaying portion 102, 102' to the private mode display content.

In some embodiment, the processor 104 may be operable to kinematically change position of the at least one displaying portion 102, 102' to private mode position. The processor 104 may be further operable to switch the at least one displaying portion 102, 102' to the private mode display content and switch to the at least a second displaying portion 102, 102' to the private mode display content public mode position.

In all of the embodiments, in response to the at least one displaying portion 102, 102' switching to a public mode position. The processor 104 may be operable to cause the at least one displaying portion 102, 102' to display public mode contents. The public mode contents may comprise a welcome note, motor vehicle operating information, and/or digital decorative content.

In all of the embodiments, in response to the at least one displaying portion 102, 102' switching to a private mode position, the processor 104 may be operable to cause the at least one displaying portion 102, 102' to display private mode contents. The private mode contents may comprise entertainment or multi-media content such as gaming content and/or video streaming, for example television broadcast.

As can be seen from the above description and the accompanying drawings, when the at least one displaying portion 102, 102' is switched from a public mode position displaying contents for all vehicle occupants to a private mode position displaying entertainment or multi-media content, only public mode contents will be displayed to the vehicle operator, while the co-vehicle operator or front vehicle passenger may enjoy entertainment or multi-media content without distracting the vehicle operator. The cross-talk between the at least one displaying portion 102 and the at least a second displaying portion 102' is at one percent or less than one percent of light rays.

The foregoing description shall be interpreted as illustrative and not be limited thereto. One of ordinary skill in the art would understand that certain modifications may come within the scope of this disclosure. Although the different non-limiting embodiments are illustrated as having specific components or steps, the embodiments of this disclosure are not limited to those combinations. Some of the components or features from any of the non-limiting embodiments may be used in combination with features or components from any of the other non-limiting embodiments. For these reasons, the appended claims should be studied to determine the true scope and content of this disclosure.

The invention claimed is:

1. A dual-viewing mode motor vehicle display system comprising:

at least one displaying portion operable to display contents; and a processor having a memory, the processor having a set of instructions stored thereon, the set of instructions retrievable from the memory, wherein the at least one displaying portion further comprises at least one illumination unit, the at least one illumination unit comprises a plurality of micro fin structures, the plurality of micro fin structures configured to provide a wide viewing mode and a narrow viewing mode;

wherein the processor is operable to kinematically change a position of the at least one displaying portion about a rotation axis; and wherein, in response to the kinematically changed position, the at least one displaying portion switches between a public mode position to display public mode contents, and a private mode position to display private mode contents, wherein each of the plurality of micro fin structures is arranged to tilt between 10 degrees to 49 degrees along an axis to provide the narrow angle arrangement.

2. The system according to claim 1, wherein the plurality of micro fin structures further comprises at least one of a wide-angle arrangement to reflect light rays supplied by the at least one illumination unit to provide the wide viewing mode, and a narrow angle arrangement to reflect light rays supplied by the at least one illumination unit to provide the narrow viewing mode.

3. The display system according to claim 1, wherein the at least one displaying portion is mounted to a central portion of a cockpit of a motor vehicle, the central portion relative to a width of the motor vehicle.

4. A dual-viewing mode motor vehicle display system, comprising:

at least one displaying portion operable to display contents; and a processor having a memory, the processor having a set of instructions stored thereon, the set of instructions retrievable from the memory, wherein the at least one displaying portion further comprises at least one illumination unit, the at least one illumination unit comprises a plurality of micro fin structures, the plurality of micro fin structures configured to provide a wide viewing mode and a narrow viewing mode;

wherein the processor is operable to kinematically change a position of the at least one displaying portion about a rotation axis; and wherein, in response to the kinematically changed position, the at least one displaying portion switches between a public mode position to display public mode contents, and a private mode position to display private mode contents, wherein each of the plurality of micro fin structures is configured to tilt substantially between 50 degrees to 70 degrees along an axis to provide the wide-angle arrangement.

5. The display system according to claim 1, wherein the processor is operable to rotate about the at least one displaying portion about the rotation axis between 10 degrees to 40 degrees.

6. The display system according to claim 1, wherein the processor is operable to rotate about the at least one displaying portion about the rotation axis between 15 degrees to 35 degrees.

7. The display system according to claim 1, wherein the processor is operable to rotate about the at least one displaying portion about the rotation axis at 20 degrees.

8. The display system according to claim 1, the display system further comprising at least one second displaying portion.

9. The display system according to claim 8, wherein the at least one second displaying portion is disposed adjacent to the at least one displaying portion.

10. The display system according to claim 1, wherein the processor is operable to kinematically change position of the at least one displaying portion to the private mode position, and switch the at least one displaying portion to the private mode display content.

11. The display system according to claim 8, wherein the processor is operable to kinematically change position of the at least one displaying portion to private mode position, switch the at least one displaying portion to the private mode display content, and switch to the at least one second displaying portion to the private mode display content in the public mode position.

12. The display system according to claim 1, wherein, in response to the at least one displaying portion switching to a public mode position, the processor is operable to cause the at least one displaying portion to display public mode contents comprising at least one of a welcome note, motor vehicle operating information, and a digital decorative content.

13. The display system according to claim 1, wherein, in response to the at least one displaying portion switching to the private mode position, the processor is operable to cause the at least one displaying portion to display private mode contents comprising at least one of gaming content, and video streaming.

14. A dual-viewing mode motor vehicle display system, comprising:

at least one displaying portion operable to display contents; and a processor having a memory, the processor having a set of instructions stored thereon, the set of instructions retrievable from the memory, wherein the at least one displaying portion further comprises at least one illumination unit, the at least one illumination unit comprises a plurality of micro fin structures, the plurality of micro fin structures configured to provide a wide viewing mode and a narrow viewing mode;

wherein the processor is operable to kinematically change a position of the at least one displaying portion about a rotation axis; and wherein, in response to the kinematically changed position, the at least one displaying portion switches between a public mode position to display public mode contents, and a private mode position to display private mode contents, wherein, at public mode position, the at least one displaying portion has a viewing angle between 20 degrees to 80 degrees.

15. The display system according to claim 1, wherein, at public mode position, the at least one displaying portion has a viewing angle at 50 degrees.

16. The display system according to claim 1, wherein the at least one displaying portion is mounted to at least a portion of a surface of a cockpit of a motor vehicle.

* * * * *